United States Patent [19]
Kropp

[11] Patent Number: 5,997,185
[45] Date of Patent: Dec. 7, 1999

[54] OPTOELECTRONIC TRANSMIT MODULE

[75] Inventor: Jörg-Reinhardt Kropp, Berlin, Germany

[73] Assignee: Siemens Aktiengesellschaft, Munich, Germany

[21] Appl. No.: 09/112,976

[22] Filed: Jul. 9, 1998

Related U.S. Application Data

[63] Continuation of application No. PCT/DE97/00052, Jan. 8, 1997.

[30] Foreign Application Priority Data

Jan. 9, 1996 [DE] Germany .......................... 196 01 955

[51] Int. Cl.$^6$ ....................................................... G02B 6/36
[52] U.S. Cl. .............................................. 385/89; 385/93
[58] Field of Search ................................. 385/33, 34, 35, 385/88, 89, 90, 91, 92, 93, 94

[56] References Cited

U.S. PATENT DOCUMENTS

| | | | |
|---|---|---|---|
| 4,732,446 | 3/1988 | Gipson et al. | 385/24 |
| 4,733,094 | 3/1988 | Carpentier et al. | 257/82 |
| 5,093,980 | 3/1992 | Bregman et al. | 360/122 |
| 5,282,080 | 1/1994 | Scifres et al. | 359/344 |
| 5,416,624 | 5/1995 | Karstensen | 385/33 |
| 5,555,334 | 9/1996 | Ohnishi et al. | 385/93 |
| 5,696,862 | 12/1997 | Hauser et al. | 385/88 |

FOREIGN PATENT DOCUMENTS

| | | |
|---|---|---|
| 0 603 549 A1 | 6/1994 | European Pat. Off. . |
| 0 622 874 A1 | 11/1994 | European Pat. Off. . |
| 0 652 454 A1 | 5/1995 | European Pat. Off. . |
| 2 536 546 | 5/1984 | France . |
| 30 19 955 A1 | 12/1981 | Germany . |
| 42 14 791 C1 | 7/1993 | Germany . |
| 43 13 492 C1 | 7/1994 | Germany . |
| 2 162 335 | 1/1986 | United Kingdom . |
| 2 276 493 | 9/1994 | United Kingdom . |

OTHER PUBLICATIONS

International Publication No. 97/25638 (Stange et al.), dated Jul. 17, 1997.
Patent Abstracts of Japan No. 59–025282 (Tetsuo), dated Jan. 9, 1984.
Patent Abstracts of Japan No. 53–135652 (Yosuke), dated Nov. 27, 1978.

*Primary Examiner*—Hung N. Ngo
*Attorney, Agent, or Firm*—Herbert L. Lerner; Laurence A. Greenberg

[57] ABSTRACT

Laser diodes have a driver current which is dependent on aging and temperature. Emitted optical power is detected and adjusted through the use of a monitor element. However, previous transmit modules are suitable only for semiconductor lasers which emit multi-directionally. The inventive optoelectronic transmit module includes a semiconductor laser which emits unidirectionally and a monitor element. Active areas of both components point toward a coupling device. Optical coupling elements in the form of lenses and reflective elements in the form of reflective surfaces are integrated into the coupling device. The configuration of the coupling device is selected to be such that at least part of emitted radiation is passed to the monitor element, but a remaining portion penetrates the coupling device to the coupling element and is injected into or coupled-in by the latter, for example to an optical waveguide. The transmit module is particularly suitable for Vertical Cavity Surface Emitting Laser Diodes.

9 Claims, 2 Drawing Sheets

OPTOELECTRONIC TRANSMIT MODULE

CROSS-REFERENCE TO RELATED APPLICATION

This application is a continuation of International Application PCT/DE97/00052, filed Jan. 8, 1997, which designated the United States.

BACKGROUND OF THE INVENTION

1. Field of the Invention

The invention relates to an optoelectronic transmit module including at least one transmit element, at least one monitor element and a coupling device having at least one optical coupling element and at least one reflective element, both the reflective element and the coupling element of the coupling device being disposed opposite a radiation-sensitive surface of the monitor element and a section of an active surface of the transmit element, the section being located on only one component side of the transmit element.

Optoelectronic transmit modules with active components, in particular semiconductor lasers, frequently have a feedback circuit for regulating a temperature-dependent and aging-dependent driver current for the semiconductor laser. A part of the radiation emitted by the laser is detected by a photodiode which is used as a monitor diode. A diode current is available as a regulating signal for the feedback circuit. Fluctuations in the intensity of the emitted radiation can thus be compensated.

A transmit module for semiconductor lasers is described in Published UK Patent Application GB 2 276 493 A, corresponding to U.S. Pat. No. 5,500,869. A monitor diode, a semiconductor laser and a lens system are disposed in series on a silicon carrier. Optical axes of the three modules are aligned coaxially with respect to one another and run parallel to the surface of the silicon carrier. The semiconductor laser has two emission directions. On one hand, a main emission direction faces the lens system. On the other hand, a smaller part is emitted in an opposed direction and is detected by the monitor diode in order to regulate the driver current. The previously known optical transmit module requires two emission directions and a precise adjustment of the individual modules with respect to one another.

An optical transmit module of the type mentioned at the outset above can be found in U.S. Pat. No. 4,733,094. The known transmit module is accommodated in a transistor housing and has, inter alia, a support plate which rests on a base component of the transistor housing. On the support plate there is a base plate on which a transmit element in the form of a luminescent diode and a photodiode are disposed one next to the other. Above the transmit element in the direction of radiation there is a semitransparent mirror after which, in the direction of radiation, a coupling element in the form of a microlens is disposed. The microlens is held in the upper part of a pot-like cover of the transistor housing. A part of the light which is output by the transmit element is reflected by the semitransparent mirror to a further mirror and directed by the latter onto the photodiode.

SUMMARY OF THE INVENTION

It is accordingly an object of the invention to provide an optoelectronic transmit module, which overcomes the hereinafore-mentioned disadvantages of the heretofore-known devices of this general type and which is comparatively simple and compact.

With the foregoing and other objects in view there is provided, in accordance with the invention, an optoelectronic transmit module, comprising at least one transmit element having component sides and an active surface with a section located on only one of the component sides; at least one monitor element having a radiation-sensitive surface; and a coupling device having a one-piece base body, at least one optical coupling element and at least one reflective element, both the at least one reflective element and the at least one coupling element directly formed on the one-piece base body opposite the radiation-sensitive surface and the section.

A significant advantage of the transmit module according to the invention is its simple structure with a single-component base body which has the reflective element and the coupling element. As a result, production can also be executed in a comparatively simple way and is thus also cost-effective. A further significant advantage resides in the adjustment which can be carried out in a relatively simple way. This is because in the transmit module according to the invention the reflective element and the coupling element have a prescribed position and, for this reason, all that is necessary is to adjust the base body with respect to the monitor element and the transmit element.

In a transmit module according to the invention in which the active surface has a plurality of lasers, the radiation of a laser can be used to regulate the driver current of all of the lasers. The surface can be divided in this case into a plurality of active regions or can be formed by combining a plurality of discrete individual lasers. A reflective element and a coupling element are disposed at least opposite a section of the active surface on a single component side. In this case the section can include one or more emitting regions or individual lasers.

In accordance with another feature of the invention, the coupling device is composed of a material which is transparent in the characteristic emissions wavelength region of the transmit element. Known planar structuring techniques can advantageously be used to integrate the coupling element and the reflective element. The adjustment of the coupling device can be carried out with an active or inactive transmit element. Both adjustment possibilities serve to obtain the desired positional alignment of the coupling device and to determine the regulating signal.

The coupling element can be constructed as a diffractive and/or refractive element. It is particularly advantageous to use a lens or a lens system or a zone plate which is applied to the side of the coupling unit facing away from the transmit element and the monitor element. It is also conceivable to use an integrated gradient index lens. A configuration on the side directly facing the electronic components is also possible.

High-precision structuring techniques can also be used for mounting the transmit element and the monitor element on a common carrier. The structure which is selected also permits monolithic integration of the transmit element and the monitor element on a semiconductor chip.

In accordance with a further feature of the invention, at least part of the radiation emitted by the section is directed onto the monitor element by reflection at the reflective element and another part of the radiation penetrates the coupling element. The coupling element is advantageously disposed on the side of the coupling device facing the transmit element. For example, the radiation may be injected or coupled by the coupling element into an optical waveguide through the use of a concave mirror.

In accordance with an added feature of the invention, the reflective element is obtained through the use of at least one mirrored region of the coupling device. The configuration of a mirrored area directly next to a lens on the side of the coupling device facing away from the transmit element is advantageous.

Likewise, reflective areas having an area alignment which is inclined at an angle with respect to the surface of the coupling device are suitable for deflection. In order to increase the degree of reflection, these depressions are also metallized or have a different reflection-amplifying coating, for example a dielectric coating.

In accordance with an additional feature of the invention, there are provided depressions in the coupling device which are mirrored at least in certain regions and which perform the function of the reflective element. For example, depressions which are shaped in the manner of concave mirrors can be used to deflect part of the radiation onto the monitor element.

In accordance with yet another feature of the invention, crystalline materials and types of glass are used for the coupling device. If crystalline materials are selected, the depressions are preferably formed through the use of anisotropic etching. Isotropic etching techniques and stamping are used with other non-crystalline materials. Silicon and gallium phosphide are particularly suitable crystalline materials.

Spacing elements can be inserted between a carrier supporting the transmit and monitor elements and the coupling device, for the purpose of spacing and optical alignment. In order to avoid disruptive reflections which are fed back onto the emission signal at the coupling device and the coupling element, the latter are provided with reflection-suppressing coatings. Such coatings are particularly significant in the case of materials with a high refractive index, for example silicon. However, feedback can also be avoided by suitably tilting the coupling device with respect to the transmit element. As a result of the tilting, radiation which may have been reflected is no longer passed to the active surface of the transmit element.

A compact and durable transmit module is formed from the coupling device and the electronic components by using known connection techniques such as soldering and bonding. Materials which have an identical thermal behavior are preferred.

In accordance with yet a further feature of the invention, in order to increase the degree of integration, the transmit and monitor elements are supported directly by the coupling device. Mounting is preferably carried out with the flip-chip technique using bumps in order to make contact. It is possible in addition to make use of the self-centering effect. For this purpose, solder surfaces which have small lumps of solder (bumps) that are melted by applying heat are provided on the surfaces of the transmit and monitor elements on one hand and the coupling device on the other hand which face one another. As a result, the transmit and monitor elements are connected to the coupling device and aligned. This embodiment is distinguished by excellent mechanical and optical stability and can be manufactured cost-effectively.

In accordance with the preferred embodiment, an electrical contact device is provided either on the carrier side or on the coupling device side. Preferably, bondable gold tracks on a silicon or glass carrier are used.

In accordance with a concomitant feature of the invention, the active surface of the transit element is formed by radiation-active transmit regions. The regions are disposed in a row or in an area. On one hand, in the case of cost-effective embodiments, the driver current of a plurality of transmit regions is regulated by a monitor element which receives the emitted radiation of a transmit region. On the other hand, in each case an associated monitor element is required for the individual regulation of each transmit region. One or more reflective elements reflect a part of the radiation emitted by the respective transmit region to the corresponding monitor element. The structure of the reflective elements and of the coupling elements can correspond to the materials being used.

Other features which are considered as characteristic for the invention are set forth in the appended claims.

Although the invention is illustrated and described herein as embodied in an optoelectronic transmit module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
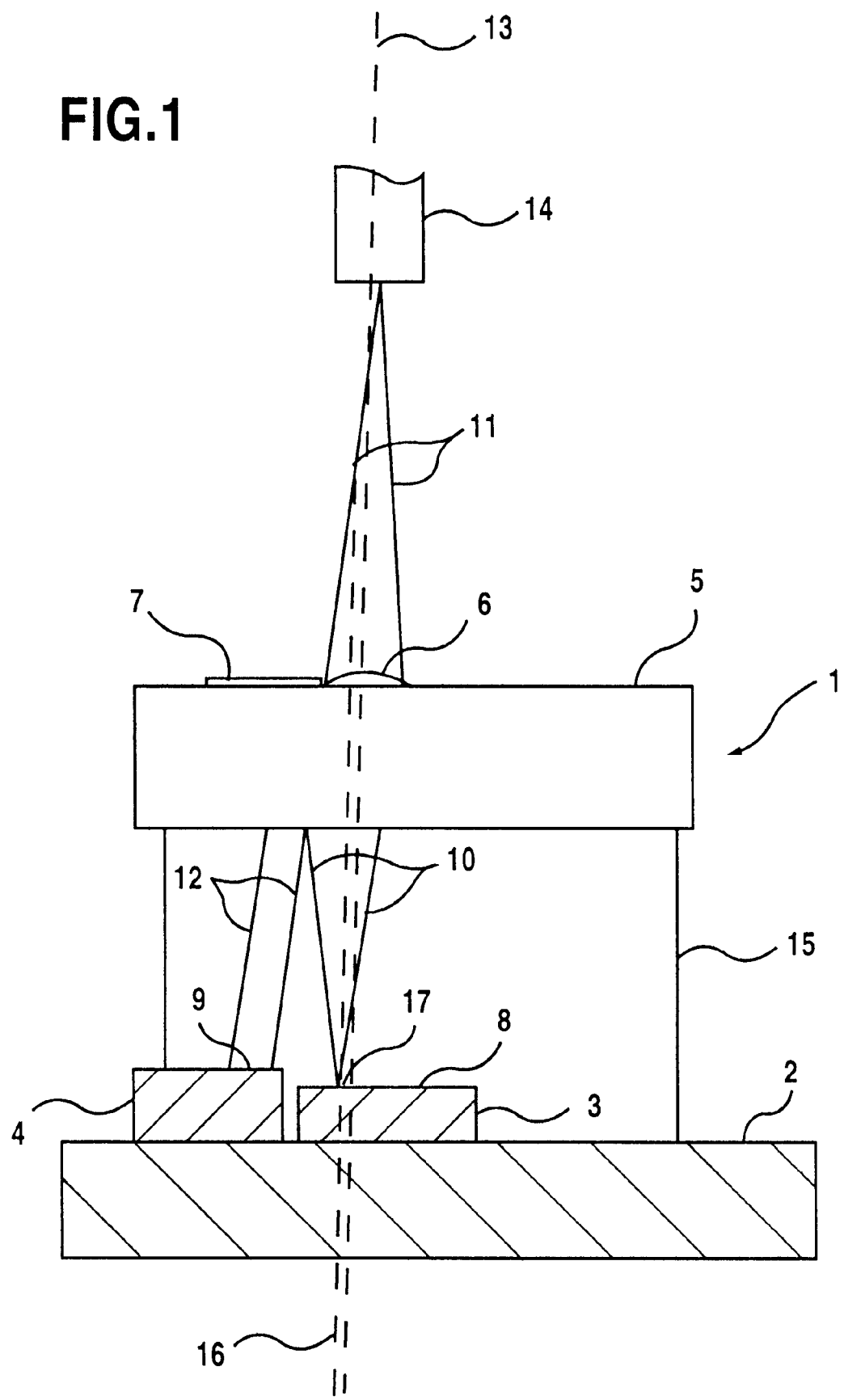
FIG. 1 is a fragmentary, diagrammatic, elevational view of an inventive transmit module with a single laser as well as a lens and a mirror on the same side of a component.

Referring now to the figures of the drawings in detail and first, particularly, to FIG. 1 thereof, there is seen a principal structure of an inventive transmit module. A transmit element 3 and a monitor element 4 are applied to a carrier material 2. An active area 8 of the transmit element 3 and a light-sensitive area 9 of the monitor element 4 point away from the carrier 2. A coupling device 1 is disposed opposite the two electronic components 3, 4 and is kept at a distance through the use of a spacing element 15. The coupling device 1 is composed of a base body 5 which has a high transmission level in a characteristic emissions wavelength region of the transmit element 3. A lens 6 and a metallized region 7 laterally bounding the lens 6 are disposed on the base body 5 on a component side of the coupling device 1 facing away from the electronic components 3, 4. The configuration of the coupling device 1 with the optical elements 6, 7 located thereon is selected in such a way that radiation 10 emitted by at least one section 17 of the active surface 8 is passed to the lens 6 and the metallized region 7 and is decomposed into a reflected radiation component 12 and into a useful component 11. The reflected radiation component 12 is reflected by the metallized region 7 onto the light-sensitive area 9 of the monitor element 4. A photocurrent of the monitor element is used to regulate a driver current of the transmit element. Electronics which are necessary for regulation are not illustrated. Regulating electronics which are adapted to the respective transmit element 3 are used.

Laterally offsetting a center axis 16 of the emitting section 17 with respect to an optical axis 13 of the lens 6 ensures that part of the emitted radiation 10 falls on the metallized region 7 and is reflected. An adjustment of the coupling device 1 is optionally made with an active or an inactive transmit element and permits the modules to be aligned with respect to one another in one operation and the regulating signal to be defined as a function of the magnitude of the reflected radiation component 12. Subsequently, the coupling device 1 is permanently connected to the spacing element 15 and the carrier 2 by bonding or soldering.

In the present embodiment, the radiation 10 emitted by the transmit element 3 completely penetrates the base body 5 of the coupling device 1 before it is split up into the reflected radiation component 12 and the useful component 11 at the upper side of the base body 5. An optical waveguide end 14 is illustrated diagrammatically at a distance from and opposite the lens 6, in order to clarify an injection or coupling-in of the useful component 11. The lens 6, which is representative of imaging optics, can also collimate the useful component 11 and thus generate a weakly divergent beam.

In production technology terms, the position of the transmit element 3, of the monitor element 4 and of the coupling device 1 can be varied as desired in order to obtain a required structure. It is essential in this case that part of the emitted radiation 10 is passed to the monitor element 4. The distance between the electronic components 3, 4 and the optical components 6, 7 can be determined through the use of the spacing elements 15. A free radiation region which is provided in this way can be used to integrate further components as required. The magnitude of the free radiation region depends essentially on the imaging optics. The diameter and the angle of aperture of the imaging optics should be adapted to the radiation geometry.

Surface-emitting elements, for example vertical cavity surface emitting lasers (VCSEL) are used as the transmit element 3. Photodiodes are suitable for the monitor element 4.

Figure 2:
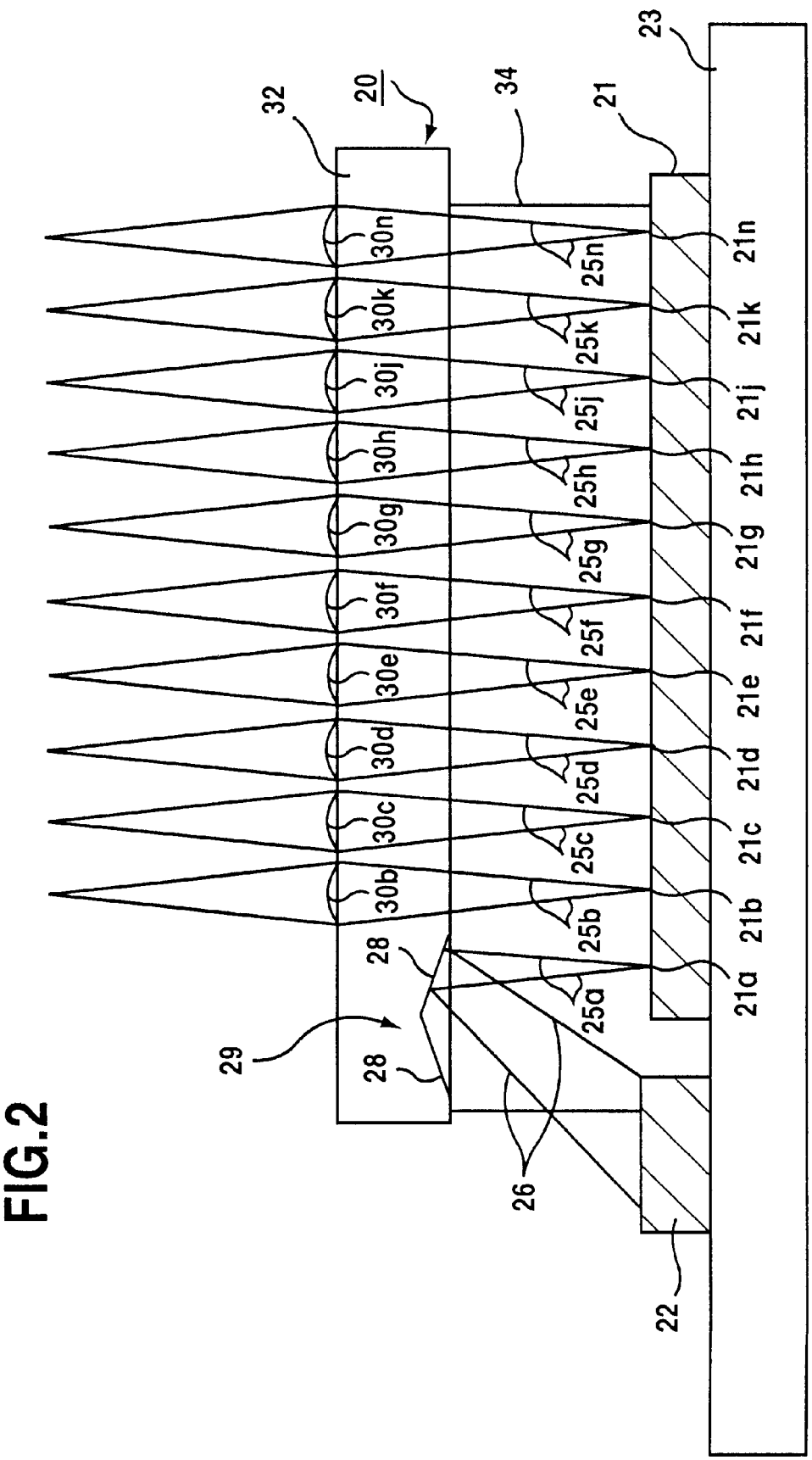
FIG. 2 is an elevational view of an inventive transmit module for a plurality of lasers with a coupling device made of glass.

FIG. 2 illustrates an expansion of the inventive concept to a row of laser diodes. In this embodiment, a laser diode array 21, preferably with a plurality of VCSEL diodes 21a to 21n, are applied to a carrier 23. A monitor diode 22 is disposed to the side of the array 21. The coupling device 20 is fixed opposite the array 21 and the monitor diode 22 and is kept at a distance through the use of a spacing element 34. A plurality of lenses 30b to 30n with identical periodicity to the VCSEL diodes 21b to 21n, are disposed on a base body 32 of the coupling device 20. A lens is assigned to each laser diode. Radiation 25b to 25n emitted by the laser diodes 21b to 21n is collimated or focused by one lens 30b to 30n in each case. In this way, a plurality of VCSEL diodes disposed in parallel can be simultaneously injected into or coupled-in to optical waveguides. The laser diodes are monolithically integrated on a semiconductor chip.

The driver current of all of the laser diodes 21a to 21n is regulated in the present embodiment through the use of the intensity of the emission of the laser diode 21a. Emitted radiation 25a from the laser diode 21a is reflected onto the monitor diode 22 by a depression 29 located in a lower surface or underside of the base body 32. The depression 29 has a prism-shaped cross section defining side walls 28 which are inclined by 20° with respect to the lower surface or underside of the base body 32. In order to increase the reflection, the side walls are provided with a reflective coating. The radiation 25a is reflected at one of the depression walls 28. Due to the inclined position of the depression wall, radiation 26 is deflected further laterally than in the embodiment in FIG. 1. For this reason, the monitor diode 22 can also be disposed at a greater distance from the laser diode 21a.

The base body 32 is composed of a suitable glass material. The depression 29 is preferably produced in the base body 32 by stamping, and is subsequently mirrored. The lenses 30b to 30n are attached to the base body 32 through the use of a suitable optical bonding agent or can also be produced by stamping the surface of the glass.

I claim:

1. An optoelectronic transmit module, comprising:
   at least one transmit element having component sides and an active surface with a section located on only one of said component sides;
   at least one monitor element having a radiation-sensitive surface; and
   a coupling device having a one-piece base body, at least one optical coupling element and at least one reflective element, both said at least one reflective element and said at least one coupling element directly formed on said one-piece base body opposite said radiation-sensitive surface and said section.

2. The optoelectronic transmit module according to claim 1, wherein said coupling device is composed of a material which is transparent in a characteristic emissions wavelength range of said at least one transmit element.

3. The optoelectronic transmit module according to claim 1, wherein at least part of radiation emitted by said section is directed onto said at least one monitor element by reflection at said reflective element, and a further part of the radiation penetrates said coupling element.

4. The optoelectronic transmit module according to claim 1, wherein said reflective element is formed by at least one mirrored region of said coupling device.

5. The optoelectronic transmit module according to claim 1, wherein said reflective element is at least one depression in said coupling device, and said at least one depression is mirrored in certain regions.

6. The optoelectronic transmit module according to claim 1, wherein said coupling device is composed of a material selected from the group consisting of crystalline material and glass.

7. The optoelectronic transmit module according to claim 1, wherein said coupling device carries said at least one transmit element and at least one said monitor element.

8. The optoelectronic transmit module according to claim 1, wherein said at least one transmit element has radiation-active transmit regions disposed in a row and forming said active surface.

9. The optoelectronic transmit module according to claim 1, wherein said at least one transmit element has radiation-active transmit regions disposed in an area and forming said active surface.

* * * * *